(12) United States Patent
Kintaka

(10) Patent No.: US 6,602,622 B2
(45) Date of Patent: Aug. 5, 2003

(54) SUPERCONDUCTING PARTS, MANUFACTURING METHOD THEREOF AND DIELECTRIC RESONATOR

(75) Inventor: Yuji Kintaka, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 129 days.

(21) Appl. No.: 10/016,757

(22) Filed: Oct. 29, 2001

(65) Prior Publication Data

US 2002/0098986 A1 Jul. 25, 2002

(30) Foreign Application Priority Data

Oct. 27, 2000 (JP) .......................... 2000-329597
Oct. 10, 2001 (JP) .......................... 2001-312968

(51) Int. Cl.⁷ .................. H01B 12/00; H01F 6/00; H01L 39/00; H01L 39/24
(52) U.S. Cl. .............. 428/701; 428/702; 505/121; 505/238; 505/434; 505/782
(58) Field of Search ................ 428/697, 699, 428/701, 702; 505/121, 125, 230, 237, 238, 430, 434, 470, 501, 782, 784

(56) References Cited

U.S. PATENT DOCUMENTS

| 5,192,739 A | * | 3/1993 | Lay .......................... 505/433 |
| 5,376,627 A | * | 12/1994 | Torii et al. .................. 505/473 |
| 6,466,805 B2 | * | 10/2002 | Balachandran et al. ...... 505/231 |
| 6,470,198 B1 | * | 10/2002 | Kintaka et al. .............. 505/210 |

FOREIGN PATENT DOCUMENTS

| JP | 2000-063120 | 2/2000 |
| JP | 2000-196155 | 7/2000 |

* cited by examiner

Primary Examiner—Tom Dunn
Assistant Examiner—Colleen P Cooke
(74) Attorney, Agent, or Firm—Dickstein, Shapiro, Morin & Oshinsky, LLP.

(57) ABSTRACT

A dielectric ceramic oxide substrate in combination with superconducting film containing Ba can be used to form a dielectric resonator which has a high no-load Q factor at a high frequency and satisfactory superconducting characteristics.

20 Claims, 3 Drawing Sheets

SUPERCONDUCTING PARTS, MANUFACTURING METHOD THEREOF AND DIELECTRIC RESONATOR

BACKGROUND OF THE INVENTION

1. Field of the Invention

The present invention relates to a superconducting part and a manufacturing method thereof. Specifically, it relates to a superconducting part that is used as a dielectric resonator and other high-frequency electronic parts and to a manufacturing method thereof.

2. Description of the Related Art

Bi-2223 phase superconductors are Bi—Pb—Sr—Ca—Cu—O oxide superconductors having a critical temperature on the order of 110 K. Such a Bi-2223 phase superconductor is formed on a substrate such as Ag or a single crystal of MgO or a ceramic oxide substrate and thereby constitutes a wire rod, current-limiting device or magnetic shielding material.

For example, a superconducting film is prepared by adding an organic vehicle to a powdered Bi-2223 phase superconductor to yield a paste for a superconducting film, applying the paste to a dielectric ceramic oxide substrate such as $Ba(Sn,Mg,Ta)O_3$, and baking the applied paste. The resulting superconducting film includes no significant heterophase and substantially comprises a single phase at the interface between the superconducting film and the dielectric ceramic substrate.

However, the superconducting film exhibits a very high surface resistance in the vicinity of the interface with the dielectric ceramic substrate, although it exhibits a relatively low surface resistance on its surface on the opposite side to the interface, when the surface resistance is determined in a high frequency region. The high surface resistance is probably caused by a microscopic interface reaction between the superconducting film and the dielectric ceramic substrate. According to a conventional technique, therefore, the superconducting film has been baked at such decreased temperatures that the interface reaction does not adversely affect the superconducting film. In this case, however, the superconducting film is not satisfactorily formed and does not sufficiently have a low surface resistance.

After intensive investigations on the interface reaction, the present inventors found that Ba contained in the dielectric ceramic substrate diffuses in a high concentration into the superconducting film. Additionally, they found that when the substrate comprises a polycrystalline substance, a partially molten melt penetrates into the grain boundaries of the substrate.

The aforementioned superconducting film has a low critical current density of 200 $A/cm^2$ (temperature: 77° K, 0T) even if it substantially comprises a single phase alone, indicating that the superconducting characteristics of the superconducting film are deteriorated not only in the vicinity of the interface with the dielectric ceramic substrate but also in a thickness direction, and further in a horizontal direction perpendicular to the thickness direction, of the superconducting film.

SUMMARY OF THE INVENTION

Under these circumstance, the present invention has been accomplished and an object of the present invention is to provide a superconducting part having excellent superconducting characteristics, as well as a manufacturing method of the superconducting part. Another object of the present invention is to provide a dielectric resonator having excellent superconducting characteristics.

Specifically, the present invention provides, in one aspect, a superconducting part including a ceramic oxide substrate and an oxide superconductor film, in which the ceramic oxide substrate comprises Ba, and the oxide superconductor film is formed on the ceramic oxide substrate, contains a Bi—Sr—Ca—Cu—O phase as a major phase and comprises Ba.

By this configuration, the Ba component in the substrate does not diffuse into the superconducting film, and the superconducting film exhibits satisfactorily improved superconducting characteristics.

In another aspect, the present invention provides a method of manufacturing a superconducting part. The method includes the steps of applying a paste for a superconducting film containing an oxide superconductor powder to a ceramic oxide substrate including Ba, which oxide superconductor powder contains a Bi—Sr—Ca—Cu—O phase as a major phase and includes Ba, and baking the paste to yield an oxide superconductor film.

This method can inhibit the diffusion of the Ba component in the ceramic oxide substrate into the superconducting film and can satisfactorily improve superconducting characteristics of the superconducting film.

In a further aspect, the present invention provides a dielectric resonator including a dielectric substrate and an oxide superconductor film electrode formed on the dielectric substrate, in which the dielectric substrate is a ceramic oxide including Ba, and the oxide superconductor film electrode is composed of an oxide superconductor film containing a Bi—Sr—Ca—Cu—O phase as a major phase and includes Ba.

By this configuration, the Ba component in the dielectric does not diffuse into the oxide superconductor film electrode, and the oxide superconductor film electrode exhibits satisfactorily improved superconducting characteristics.

DESCRIPTION OF THE PREFERRED EMBODIMENTS

Figure 1:
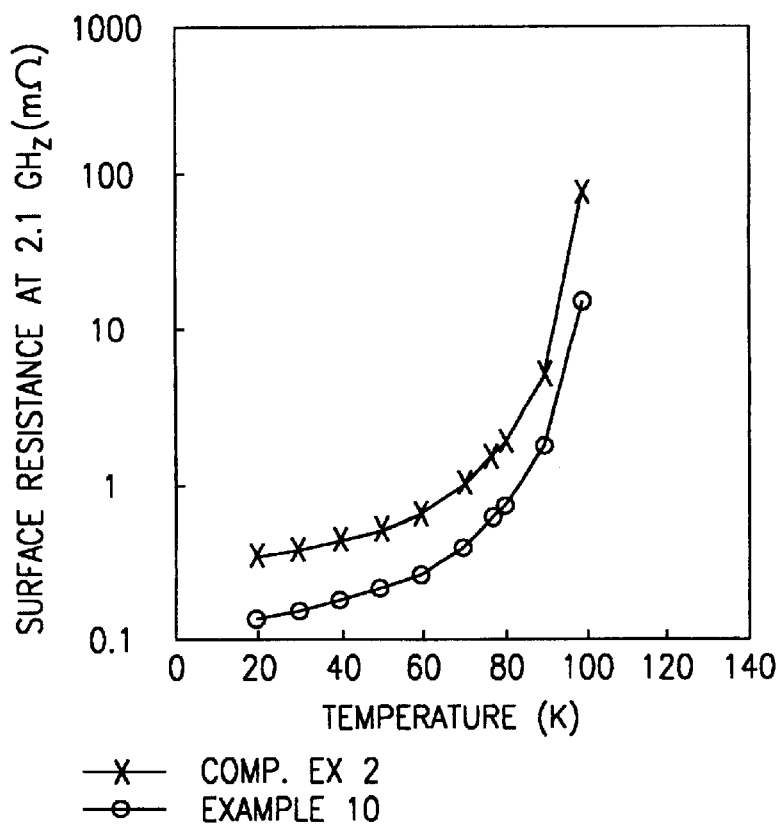
FIG. 1 is a graph showing the relationship between temperatures and the surface resistances of Comparative Example 2 and of Example 10.

As is described above, when a barium tantalate ceramic or another ceramic oxide substrate comprising Ba and having a composite perovskite structure is used, the Ba diffuses from the ceramic oxide substrate into the superconducting film during baking and thereby deteriorates the electric characteristics of the superconducting film especially in the interface between the ceramic oxide substrate and the superconducting film. Possible candidates for the mechanism of the deterioration are the following first and second mechanisms.

According to the first deterioration mechanism, the characteristics of the superconducting film are supposed to deteriorate in the following manner. The superconducting film containing the diffused Ba has an inclined Ba concentration depending on the degree of diffusion of the Ba and therefore has a continuously decreased partial melting temperature depending on the amount of Ba.

Specifically, the Ba in the ceramic oxide substrate diffuses into the paste for a superconducting film during the baking operation, and the partial melting temperature of the superconducting film decreases depending on the diffusion of Ba. Accordingly, even if the paste is baked at the optimum temperature for the superconducting film itself, the baking temperature is not optimum in a region containing the diffused Ba. The superconducting film in the vicinity of the interface especially contains the diffused Ba in a large amount, becomes overfired and thereby has deteriorated electric characteristics. As a possible solution to this problem, the baking temperature can gradually be decreased during the baking operation. However, control of the baking temperature is difficult and this technique is not practical.

According to the second deterioration mechanism, the characteristics of the superconducting film are supposed to deteriorate in the following manner. The ceramic oxide substrate has a polycrystalline structure, and the Ba constituting the substrate diffuses and migrates into the melt of a superconducting substance formed during the baking operation and thereby increases wettability of the melt toward the polycrystalline grain boundaries of the substrate, thus inviting grain boundary penetration. The melt penetrates into the boundaries, changes the composition of superconducting film and thereby deteriorates the characteristics of the superconducting film especially in the vicinity of the interface.

To avoid such deterioration, the superconducting part of the present invention comprises a ceramic oxide substrate comprising Ba, and an oxide superconductor film being formed on the ceramic oxide substrate, containing a Bi—Sr—Ca—Cu—O phase as a major phase and comprising Ba.

By previously adding Ba to a paste for a superconducting film as a precursor of the superconducting film, the characteristics in the vicinity of the interface between the ceramic oxide substrate and the superconducting film can be prevented from changing, even if the deterioration occurs according to the first or second mechanism. Accordingly, the resulting superconducting part has improved superconducting characteristics in the high-frequency regions.

According to the present invention, an intermediate layer comprising a polycrystalline substance or an amorphous substance is preferably formed between the ceramic oxide substrate and the superconducting film. Specifically, the advantages of the superconducting film comprising the Ba can also be exhibited even when the intermediate layer is formed on the ceramic oxide substrate comprising the Ba. When the intermediate layer comprises a polycrystalline substance of, for example, Ag and contains large amounts of grain boundaries, the Ba diffuses through the grain boundaries of the intermediate layer and thereby induces the interface reaction between the substrate containing Ba and the superconducting film. Similar advantages can be obtained when the intermediate layer comprises an amorphous substance such as a Bi—Si—B—O glass. This is because the crystals in the amorphous substance are fully disturbed, and Ba in the ceramic oxide substrate can as easily diffuse into the substrate as in the grain boundaries in the polycrystalline substance.

The molar ratio, Ba/(Ba+Sr), of Ba to the total of Ba and Sr (Ba+Sr) in the oxide superconductor film preferably falls within a range of from about 0.02 to 0.15. When the contents of Ba and Sr are selected so that the molar ratio falls within this range, the superconducting film can have further improved superconducting characteristics.

The ceramic oxide substrate may comprise a dielectric ceramic. A dielectric ceramic having a composite perovskite structure containing Ba, such as a barium tantalate dielectric ceramic, can advantageously be used. When the superconducting part of the present invention is used as a dielectric resonator, the ceramic oxide substrate typically preferably comprises at least one $Ba(Sn,Mg,Ta)O_3$ ceramic or $Ba(Mg,Nb)O_3$ ceramic.

In the oxide superconductor film, the added Ba element is supposed to constitute a solid solution in the major phase, the Bi—Sr—Ca—Cu—O phase, and substitutes for some Sr.

The present invention will be illustrated in further detail with reference to several examples and comparative examples below, which are not intended to limit the scope of the invention.

EXPERIMENTAL EXAMPLE 1

First Embodiment

As starting material powders, $Bi_2O_3$, PbO, $SrCO_3$, $BaCO_3$, $CaCO_3$ and CuO were prepared and weighed so as to yield compositions after calcination of $Bi_{1.85}Pb_{0.35}Sr_xBa_yCa_{2.05}Cu_{3.35}O_z$, where x is 1.8 to 2.0; y is 0 to 0.4; and z is 10 to 11, and where z depends on the total moles of the metal elements. The material powders were pulverized with an organic solvent in a ball mill, and were calcined at 780° C. for 12 hours to yield calcined powders. The calcined powders were pulverized and were calcined at 780° C. for 12 hours, were further pulverized in a ball mill to thereby yield oxide superconductor powders. The compositions of the prepared oxide superconductor powders are shown in Table 1. The oxide superconductor powders were respectively mixed with an organic vehicle to thereby yield pastes for superconducting films.

A dielectric ceramic substrate (relative dielectric constant: ∈r=24) having a diameter of 35 mm and a thickness of 3 mm and comprising a polycrystalline $Ba(Sn,Mg,Ta)O_3$ dielectric was prepared. Each of the pastes for superconducting films was applied to the both end faces of the dielectric ceramic substrate by screen printing, and then heated at 400° C. to evaporate and burn out organic matters and thereby yielded a thick film for superconducting on the dielectric ceramic substrate.

The thick film was then further pressurized at a pressure of 2 ton/cm$^2$ by cold isostatic pressing, was fired at 835° C. in an atmosphere of 8% oxygen gas for 50 hours and thereby yielded a dielectric resonator having an oxide superconductor film electrode, which oxide superconductor film electrode contained a Bi—Pb—Sr—Ca—Cu—O phase as a major phase and comprised Ba.

The resulting dielectric resonator was placed in a metallic cavity formed from oxygen-free copper to constitute a $TM_{010}$-mode dielectric resonator, and the Q factor of the resulting dielectric resonator at no load (hereinafter briefly referred to as "no-load Q factor") was determined at 2.1 GHz at temperatures ranging from 20 K to 100 K.

In this dielectric resonator, a high-frequency magnetic field concentrates in the $Ba(Sn,Mg,Ta)O_3$ dielectric ceramic substrate, and a high-frequency current concentrates and flows in the vicinity of the superconducting film and the dielectric ceramic substrate. Specifically, the condition of the interface between the superconducting film and the dielectric ceramic substrate largely affects the no-load Q factor of the dielectric resonator.

The no-load Q factor of the dielectric resonator at 70° K and the surface resistance of the superconducting film in the interface with the dielectric ceramic substrate are shown in Table 1. The surface resistance was calculated from the no-load Q factor.

TABLE 1

| | Composition: $Bi_{1.85}Pb_{0.35}Sr_xBa_yCa_{2.05}Cu_{3.35}O_z$ | | | No-load Q at 70K | Surface resistance (mΩ) |
|---|---|---|---|---|---|
| | x | y | Ba/(Ba + Sr) | z | |
| Com. Ex. 1 | 1.8 | 0 | 0.000 | 10.325 | 16000 | 1.50 |
| Example 1 | 1.8 | 0.03 | 0.016 | 10.355 | 17000 | 1.41 |
| Example 2 | 1.8 | 0.05 | 0.027 | 10.375 | 27000 | 0.87 |
| Example 3 | 1.8 | 0.1 | 0.053 | 10.425 | 35000 | 0.66 |
| Example 4 | 1.8 | 0.2 | 0.100 | 10.525 | 36000 | 0.64 |
| Example 5 | 1.8 | 0.3 | 0.143 | 10.625 | 23000 | 1.03 |
| Example 6 | 1.8 | 0.4 | 0.182 | 10.725 | 17000 | 1.41 |
| Com. Ex. 2 | 1.9 | 0 | 0.000 | 10.425 | 24000 | 0.98 |
| Example 7 | 1.9 | 0.03 | 0.016 | 10.455 | 25000 | 0.94 |
| Example 8 | 1.9 | 0.05 | 0.026 | 10.475 | 33000 | 0.70 |
| Example 9 | 1.9 | 0.1 | 0.050 | 10.525 | 51000 | 0.44 |
| Example 10 | 1.9 | 0.2 | 0.095 | 10.625 | 57000 | 0.38 |
| Example 11 | 1.9 | 0.3 | 0.136 | 10.725 | 37000 | 0.62 |
| Example 12 | 1.9 | 0.4 | 0.174 | 10.825 | 26000 | 0.91 |
| Com. Ex. 3 | 2 | 0 | 0.000 | 10.525 | 22000 | 1.08 |
| Example 13 | 2 | 0.03 | 0.015 | 10.555 | 23000 | 1.03 |
| Example 14 | 2 | 0.05 | 0.024 | 10.575 | 32000 | 0.73 |
| Example 15 | 2 | 0.1 | 0.048 | 10.625 | 51000 | 0.44 |
| Example 16 | 2 | 0.2 | 0.091 | 10.725 | 55000 | 0.40 |
| Example 17 | 2 | 0.3 | 0.130 | 10.825 | 35000 | 0.66 |
| Example 18 | 2 | 0.4 | 0.167 | 10.925 | 23000 | 1.03 |

Table 1 shows that the dielectric resonator of Comparative Example 2 containing no Ba in the superconducting film had a no-load Q factor at 2.1 GHz and 70° K of 24,000 and a surface resistance of 0.98 mΩ. In contrast, the dielectric resonator of Example 10 had a no-load Q factor of 57,000 and a surface resistance of 0.38 mΩ.

The relationships between the temperatures and the surface resistance of the superconducting films of Comparative Example 2 and Example 10 were compared and are shown in FIG. 1.

With reference to FIG. 1, the superconducting film containing Ba (Example 10) had a surface resistance lower than the superconducting film containing no Ba (Comparative Example 2) within the overall temperature range. Specifically, the superconducting film comprising the Ba has improved high-frequency characteristics in the interface between the superconducting film and the dielectric ceramic substrate.

Additionally, Table 1 shows that the molar ratio, Ba/(Ba+Sr), of Ba to the total of Ba and Sr (Ba+Sr) in the superconducting film is preferably from about 0.02 to 0.15 and more preferably from about 0.05 to 0.1. Within this range, the resulting dielectric resonators each have a high no-load Q factor and a low surface resistance.

In the present embodiment, the superconducting film substantially comprises a single phase of a Bi—Sr—Ca—Cu—O phase and contains no heterophases. The Ba in the superconducting film is supposed to constitute a solid solution in the Bi—Sr—Ca—Cu—O phase and substitutes for Sr in the Bi—Sr—Ca—Cu—O phase.

EXPERIMENTAL EXAMPLE 2

Second Embodiment

A paste for a superconducting film having the same composition as in Example 10 of Experimental Example 1 was prepared in the same manner as in Experimental Example 1.

The prepared paste for a superconducting film was applied and baked onto a rectangular dielectric ceramic substrate comprising a polycrystalline $Ba(Sn,Mg,Ta)O_3$ dielectric in the same manner as in Experimental Example 1 and thereby yielded a superconducting film about 10 μm thick. The superconducting film was found to have a critical current density of 3,000 $A/cm^2$ (77° K, OT) as determined by a direct-current four-terminal method. Separately, a superconducting film was prepared using a paste for a superconducting film having the same composition as Comparative Example 2 and was found to have a critical current density of 200 $A/cm^2$ (77° K, OT).

These results show that the superconducting film comprising Ba can yield a higher critical current density than the superconducting film containing no Ba.

In this connection, the critical current density is determined using direct current and is affected by the characteristics of the entire superconducting film. Specifically, the superconducting characteristics of the superconducting film are improved by the addition of Ba in a broad range in a thickness direction of the superconducting film, in addition to the vicinity of the interface between the dielectric ceramic substrate and the superconducting film as shown in Experimental Example 1. In other words, the interface reaction in the superconducting film containing no Ba occurs in a broad region in a thickness direction of the superconducting film. The intensity of the interface reaction is supposed to gradually decrease from the vicinity of the interface with the dielectric ceramic substrate to the surface of the superconducting film. The resulting superconducting part having an improved critical current density property can advantageously applied to a current-limiting device, wire rod and other applications. In addition, this type of superconducting part can also yield similar advantages in parts for use in the high-frequency regions, in which a superconducting film is directly formed on a dielectric, and a high-frequency current concentrates and flows in the vicinity of the interface between the superconducting film and the dielectric, as well as in the disc-shaped $TM_{010}$-mode dielectric resonator.

Figure 2:
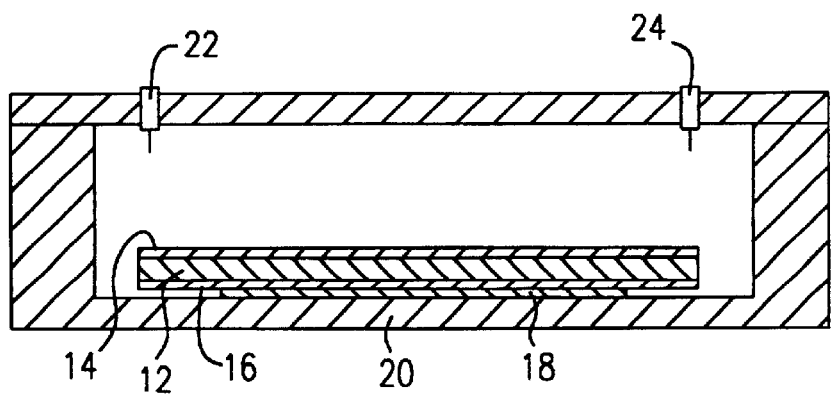
FIG. 2 is a sectional view of a $TM_{010}$-mode dielectric resonator as an embodiment of the present invention.

FIG. 2 is a diagram of a disc-shaped $TM_{010}$ mode dielectric resonator used in the present embodiment. With reference to FIG. 2, a dielectric resonator 10 includes a dielectric ceramic substrate 12, and the dielectric ceramic substrate 12 carries superconducting film electrodes 14 and 16 formed on both sides thereof, respectively. The dielectric ceramic substrate 12 is fixed via a polytetrafluoroethylene sheet 18 to the inside of a metallic casing 20. The metallic casing 20 includes driving cables 22 and 24 in the vicinity of both ends, respectively. In the dielectric resonator 10, the dielectric ceramic substrate 12 comprises the aforementioned dielectric ceramic substrate, and the superconducting film electrodes 14 and 16 each comprise the above superconducting film comprising the Ba element.

EXPERIMENTAL EXAMPLE 3

Third Embodiment

Using an oxide superconductor powder having a composition of $Bi_{1.85}Pb_{0.35}Sr_{1.90}Ba_{0.20}Ca_{2.05}Cu_{3.05}O_z$, a paste for a superconducting film was prepared in the same manner as in Experimental Example 1.

Figure 3:
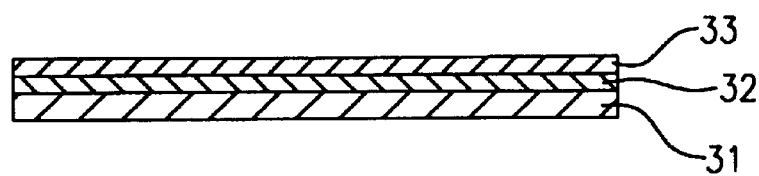
FIG. 3 is a sectional view of a dielectric substrate carrying an intermediate layer formed on its surface and a superconducting film formed on the intermediate layer.

A dielectric ceramic substrate 31 shown in FIG. 3 was prepared. The dielectric ceramic substrate 31 included a polycrystalline $Ba(Sn,Mg,Ta)O_3$ dielectric and had a diameter of 30 mm and a thickness of 3 mm. A paste for an intermediate layer containing a dispersed Ag powder in an organic vehicle was applied to the surface of the dielectric ceramic substrate 31 by screen printing, was baked at 850° C. for 1 hour and thereby yielded an intermediate layer 32. The above-prepared paste for a superconducting film was applied onto the intermediate layer by screen printing, was baked in the same manner as in Experimental Example 1 and thereby yielded a superconducting film electrode 33. The intermediate layer 32 and the superconducting film electrode 33 each had a thickness of 10 μm, respectively.

Figure 4:
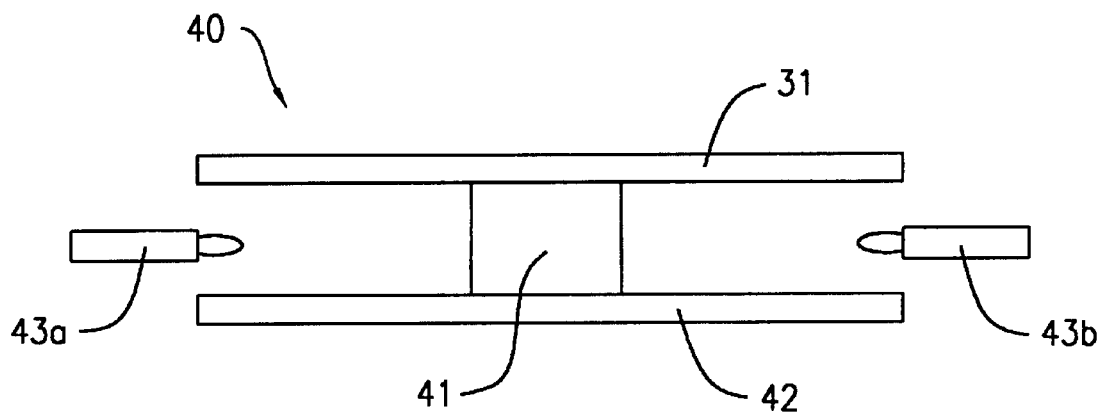
FIG. 4 is a sectional view of a TE-mode dielectric resonator as another embodiment of the present invention.

FIG. 4 is a diagram of a TE-mode dielectric resonator using the dielectric ceramic substrate 31. In the dielectric resonator 40, the dielectric ceramic substrate 31 is bonded to one edge of a support 41 in such a manner that the superconducting film electrode 33 shown in FIG. 3 faces the support 41. The support 41 includes a polycrystalline $Ba(Sn, Mg,Ta)O_3$ dielectric, is cylindrical and has a diameter of 8.5 mm and a thickness of 3.8 mm.

The support 41 carries an oxygen-free copper plate 42 being bonded at the other edge of the support 41 and having a diameter of 30 mm and a thickness of 3 mm. In addition, two high-frequency probes 43a and 43b face each other with the interposition of the support 41.

The dielectric resonator 40 had a resonance frequency of 10.7 GHz and was found to have a no-load Q factor at 70° K of 15500. This value corresponds to 3.5 mΩ in terms of the surface resistance of the superconducting film electrode.

A comparative example in Experimental Example 3 will be illustrated below. In this comparative example, the same procedures as in Experimental Example 1 were employed unless otherwise specified.

Initially, a paste for a superconducting film having a composition of $Bi_{1.85}Pb_{0.35}Sr_{1.90}Ca_{2.05}Cu_{3.05}O_z$ and containing no Ba was prepared. Separately, an intermediate layer mainly comprising Ag was formed on the surface of a dielectric ceramic substrate composed of a polycrystalline $Ba(Sn,Mg,Ta)O_3$ dielectric. The above-prepared paste for a superconducting film was applied onto the intermediate layer and thereby yielded a superconducting film electrode about 10 μm thick. Using the resulting dielectric substrate carrying the superconducting film, a TE-mode resonator (resonance frequency: 10.7 GHz) having the configuration shown in FIG. 4 was prepared. The TE-mode resonator was found to have a no-load Q factor at 70° K of 13,500, corresponding to 7 mΩ in terms of the surface resistance of the superconducting film electrode.

These results show that a superconducting film containing Ba can also yield advantages even if an intermediate layer is formed on a substrate containing Ba. This is because the intermediate layer comprises a polycrystalline Ag and includes large amounts of grain boundaries, the Ba diffuses through the grain boundaries of the intermediate layer and thereby induces the interface reaction between the substrate containing Ba and the superconducting film electrode.

This embodiment is described by taking the case where the intermediate layer comprises a polycrystalline substance. Similar advantages can be obtained in the case where the intermediate layer comprises an amorphous substance such as a Bi—Si—B—O glass. This is because the amorphous substance fully comprises disturbed crystals and Ba in the ceramic oxide substrate can easily diffuse into the substrate as in the grain boundaries in the polycrystalline substance.

In the TE-mode resonator according to this embodiment, a high-frequency current concentrates on the superconducting film side opposite to the interface with the intermediate layer. In other words, the high-frequency current concentrates on the exposed surface of the superconducting film. The characteristics of the superconducting film on this side largely affects the high-frequency characteristics. Even the superconducting film containing no Ba, in which the interface reaction with the substrate occurs, has better high-frequency characteristics on the exposed surface of the superconducting film than those on the interface side thereof. However, the absolute values of the high-frequency characteristics of this superconducting film are decreased due to the interface reaction, as compared with the case where the interface reaction does not occur. This is also true when an intermediate layer composed of a polycrystalline or amorphous substance is formed on the substrate, since the intermediate layer composed of a polycrystalline or amorphous substance does not sufficiently and effectively suppress the interface reaction. By using a superconducting film containing Ba as in the present example, the high-frequency characteristics of the superconducting film can be improved also on the exposed surface thereof.

EXPERIMENTAL EXAMPLE 4

Fourth Embodiment

A paste for a superconducting film having the same composition as in Example 10 of Experimental Example 1 was prepared in the same manner as in Experimental Example 1. Separately, a cylinder 51 for a coaxial dielectric resonator (hereinafter briefly referred to as "cylinder 51") shown in FIG. 5A was prepared. The cylinder 51 was a dielectric ceramic substrate composed of a polycrystalline $Ba(Sn,Mg,Ta)O_3$ dielectric and had a diameter of 2.8 mm and a length of 18 mm.

Figures 5A, 5B:
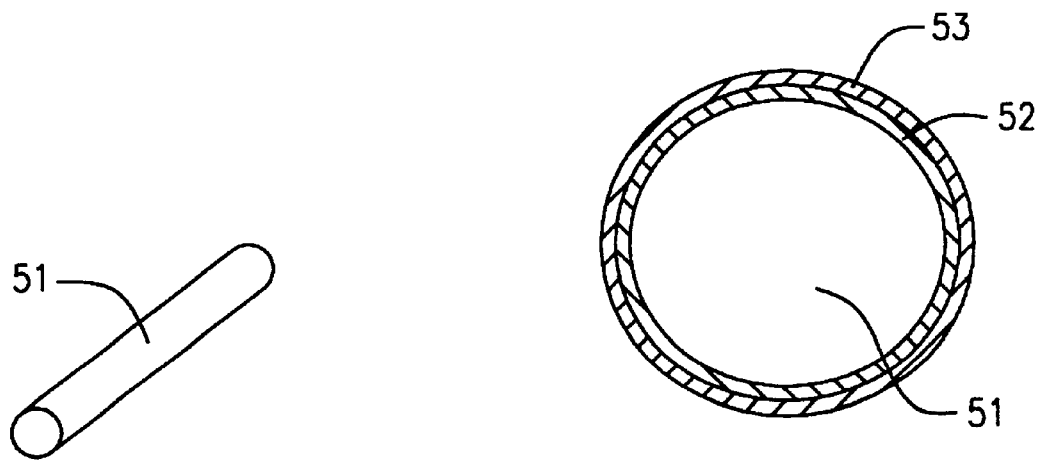
FIGS. 5A and 5B are each a perspective view and a sectional view, respectively, of a cylindrical dielectric carrying an intermediate layer formed on its surface and a superconducting film formed on the intermediate layer.

With reference to FIG. 5B, a paste for an intermediate layer mainly containing Ag was then applied onto the outer surface of the cylinder 51 except for the both ends thereof, and was baked at 850° C. for 1 hour to thereby yield an intermediate layer 52. The above-prepared paste for a superconducting film was then applied onto the intermediate layer 52 and thereby yielded superconducting film electrode 53 in the same manner as in Experimental Example 1. The intermediate layer 52 and the superconducting film electrode 53 each had a thickness of 10 μm, respectively.

Figure 6A:
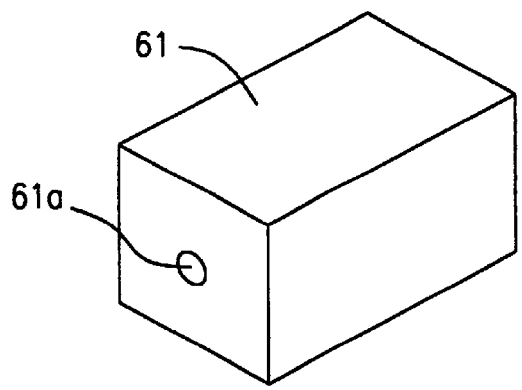
FIGS. 6A and 6B are each a perspective view and a sectional view, respectively, of a square-columnar dielectric having a through-hole into which the cylindrical dielectric of FIG. 5 is inserted.

A dielectric block 61 shown in FIG. 6A and comprising a $Ba(Sn,Mg,Ta)O_3$ dielectric was prepared. The dielectric block 61 was box-shaped, 17 mm wide, 17 mm high and 18 mm long, and included a through-hole 61a having a diameter of 2.9 mm and a length of 18 mm formed from one end to the other end of the dielectric block 61.

Figure 6B:
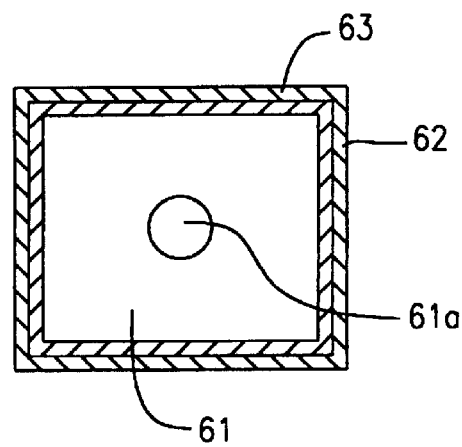

With reference to FIG. 6B, a superconducting film 62 was then formed on the outer surface of the dielectric block 61 except for the both ends, and an outer conductor 63 comprising Ag was formed on the superconducting film 62. The superconducting film 62 and the outer conductor 63 each had a thickness of 10 μm, respectively.

Figure 7:
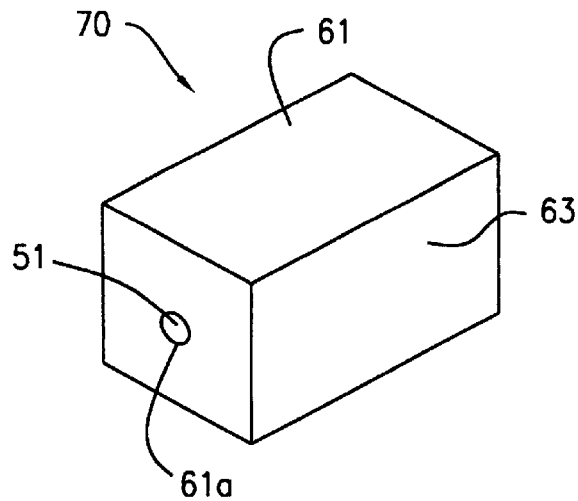
FIG. 7 is a perspective view of a coaxial dielectric resonator as another embodiment of the present invention.

With reference to FIG. 7, the cylinder 51 shown in FIGS. 5A and 5B was inserted into the through-hole 61a of the dielectric block 61 and thereby yielded a coaxial dielectric resonator 70.

The dielectric resonator 70 had a resonance frequency of 1.9 GHz and was found to have a no-load Q factor at 70° K of 63,700.

The dielectric resonator 70 included the outer conductor 63 composed of Ag formed on the superconducting film 62. At room temperature where the conductivity of the superconducting film 62 is low, a high-frequency current also flows through the outer conductor 63 in addition to the superconducting film 62, and thereby the outer conductor serves as an electrode. By this configuration, the dielectric resonator 70 resonates even at room temperature. The dielectric resonator 70 was found to have a no-load Q factor at room temperature of 2,000.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A superconducting part comprising the combination of:
    an ceramic oxide substrate comprising Ba; and
    a Bi-2223 phase superconductor film containing a Bi—Sr—Ca—Cu—O phase as a major phase and further comprising Ba.

2. The superconducting part according to claim 1, wherein the molar ratio, Ba/(Ba+Sr), of Ba to the total of Ba and Sr (Ba+Sr) in the Bi-2223 phase superconductor film is from about 0.02 to 0.15.

3. The superconducting part according to claim 2, wherein the Ba/(Ba+Sr) ratio is from about 0.05 to 0.1.

4. The superconducting part according to claim 3, wherein the ceramic oxide substrate is a dielectric ceramic.

5. The superconducting part according to claim 4, further comprising an intermediate layer between the ceramic oxide substrate and the Bi-2223 phase superconductor film, wherein the intermediate layer comprising a polycrystalline substance or an amorphous substance.

6. The superconducting part according to claim 1, further comprising an intermediate layer between the ceramic oxide substrate and the Bi-2223 phase superconductor film, the intermediate layer comprising a polycrystalline substance or an amorphous substance.

7. The superconducting part according to claim 1, wherein the ceramic oxide substrate is a dielectric ceramic.

8. The superconducting part according to claim 7, wherein the ceramic substrate and the Bi-2223 phase superconductor film are configured so as to form a dielectric resonator.

9. The superconducting part according to claim 8, further comprising an intermediate layer between the ceramic substrate and the superconductor film electrode, wherein the intermediate layer comprises a polycrystalline substance or an amorphous substance.

10. The superconducting part according to claim 9, wherein the dielectric substrate comprises at least one $Ba(Sn,Mg,Ta)O_3$ or $Ba(Mg,Nb)O_3$ ceramic.

11. The superconducting part according to claim 7, wherein the dielectric substrate comprises at least one $Ba(Sn,Mg,Ta)O_3$ or $Ba(Mg,Nb)O_3$ ceramic.

12. The superconducting part according to claim 1, wherein the Ba is in solid solution in the Bi—Sr—Ca—Cu—O phase of the Bi-2223 phase superconductor film.

13. A method of manufacturing a superconducting part, the method comprising
    applying a superconducting film paste to a ceramic oxide substrate comprising Ba or to an intermediate layer comprising a baked inorganic polycrystalline or amorphous substance on the ceramic oxide substrate, and
    baking the superconducting film paste to yield a Bi-2223 phase superconductor film;
    wherein the paste comprises an Bi-2223 phase superconductor powder containing a Bi—Sr—Ca—Cu—O phase as a major phase and further comprises Ba.

14. The method of manufacturing a superconducting part according to claim 13, wherein the molar ratio, Ba/(Ba+Sr), of Ba to the total of Ba and Sr (Ba+Sr) in the Bi-2223 phase superconductor film is from about 0.02 to 0.15.

15. The method of manufacturing a superconducting part according to claim 14, wherein the Ba/(Ba+Sr) ratio is from about 0.05 to 0.1.

16. The method of manufacturing a superconducting part according to claim 13, wherein the ceramic oxide substrate is a dielectric ceramic.

17. The method of manufacturing a superconducting part according to claim 13, wherein the superconducting film paste is applied to the intermediate layer.

18. The method of manufacturing a superconducting part according to claim 17, wherein the substrate comprises at least one $Ba(Sn,Mg,Ta)O_3$ or $Ba(Mg,Nb)O_3$ dielectric ceramic.

19. The method of manufacturing a superconducting part according to claim 13, wherein the superconducting film paste is applied to the ceramic substrate.

20. The method of manufacturing a superconducting part according to claim 19, wherein the substrate comprises at least one $Ba(Sn,Mg,Ta)O_3$ or $Ba(Mg,Nb)O_3$ dielectric ceramic.

* * * * *